United States Patent

Ota et al.

[11] Patent Number: 6,040,117
[45] Date of Patent: Mar. 21, 2000

[54] NEGATIVE PHOTORESIST STRIPPING LIQUID COMPOSITION

[75] Inventors: Toshiyuki Ota; Kimiyasu Sano, both of Tsukuba; Hideaki Tashiro, Yokkaichi; Hozumi Sato, Tsukuba, all of Japan

[73] Assignee: JSR Corporation, Tokyo, Japan

[21] Appl. No.: 09/028,290

[22] Filed: Feb. 24, 1998

[30] Foreign Application Priority Data

Feb. 24, 1997 [JP] Japan ................................ 9-055549

[51] Int. Cl.⁷ ....................................................... G03F 7/42
[52] U.S. Cl. ............................................. 430/311; 510/176
[58] Field of Search ............................... 430/331; 510/176

[56] References Cited

U.S. PATENT DOCUMENTS

| | | | |
|---|---|---|---|
| 3,679,410 | 7/1972 | Vrancken et al. | 96/27 |
| 4,004,924 | 1/1977 | Vrancken et al. | 96/35 |
| 5,597,678 | 1/1997 | Honda et al. | 430/331 |
| 5,792,274 | 8/1998 | Tanabe et al. | 134/1.3 |
| 5,795,702 | 8/1998 | Tanabe et al. | 430/331 |
| 5,849,467 | 12/1998 | Sato et al. | 430/327 |

FOREIGN PATENT DOCUMENTS

| | | |
|---|---|---|
| 1-042653 | 2/1989 | Japan . |
| 7-28254 | 1/1995 | Japan . |

*Primary Examiner*—Sharon Gibson
*Assistant Examiner*—Jill N. Holloman
*Attorney, Agent, or Firm*—Oblon, Spivak, McClelland, Maier & Neustadt, P.C.

[57] ABSTRACT

A negative photoresist stripping liquid composition is provided which comprises from 30 to 75% by weight of dimethyl sulfoxide, from 20 to 65% by weight of 1,3-dimethyl-2-imidazolidinone, from 0.1 to 5% by weight of a tetraalkylammonium hydroxide and from 0.5 to 15% by weight of water. The composition has a superior stripping performance especially against photoresists that are alkali-developable and can form films of at least 20 μm in thickness, and has no problem of freezing even when stored outdoors in the winter. The composition is useful for the stripping of negative photoresists for bump formation and for fabricating circuit substrates.

16 Claims, No Drawings

NEGATIVE PHOTORESIST STRIPPING LIQUID COMPOSITION

BACKGROUND OF THE INVENTION

1. Field of the Invention

This invention relates to a negative photoresist stripping liquid composition, and more particularly to a stripping liquid composition for negative photoresists having an alkali developability, suited for photofabrication such as wiring and bump formation carried out when circuit substrates are manufactured and semiconductors and electronic parts are packaged on the circuit substrates.

2. Description of the Prior Art

The photofabrication is a generic term for techniques in which a photoresist comprised of a photosensitive or radiation-sensitive resin composition is coated on the surfaces of process articles such as silicon wafer substrates and the coating films formed are patterned by photolithography, followed by, using the patterns as masks, chemical etching or electrolytic etching, or electroforming chiefly using electroplating, any of which are applied alone or in combination, to fabricate various precision parts. This is prevalent in the current precision fine processing techniques.

In recent years, with the downsizing of electronic equipment, there is rapid progress toward higher integration and multi-layer fabrication of LSIs, and a demand for multipin packaging on substrates for mounting LSIs on electronic equipment, where the bare chip packaging carried out by the TAB system or flip-chip system has attracted notice. In such multipin packaging, wiring must be made finer and protruded electrodes of 20 μm or more in height, called bumps (minute electrodes) serving as connecting terminals, must be arranged on the substrate with high precision, and it has become required to make the wiring and bumps more precise so as to be adaptable to any further miniaturization of LSIs in the future.

For example, as requirements on materials for bump formation used when such bumps are formed, it is necessary that they can form films of at least 20 μm in thickness, have an adhesion to the substrates, have a resistance to plating solutions used when plated to form bumps and a good wettability to the plating solutions. Under such circumstances, an alkali-developable thick-film forming negative photoresist that can form films of at least 20 μm in thickness is proposed as a bump-forming material (Japanese Unexamined Patent Publication No. 301911/1997. When bumps and/or wiring are formed using such an alkali-developable thick-film forming negative photoresist, a pattern of the resist is formed on a substrate by photolithography, followed by plating using the pattern as a mask. Thereafter, unwanted resist films are stripped with a stripping solution, thus the bumps and/or wiring are formed.

Negative photoresists have a better plating resistance than positive photoresists because unexposed areas are cured to form a pattern, and can form even the films of at least 20 μm in thickness having a good shape. Thus, the former is useful for bump formation and for fabricating circuit substrates. However, negative photoresists, in particular, the negative photoresists formed into thick films as stated above have had a disadvantage that the films can be stripped with difficulty or can not be stripped with ease, compared to positive photoresists.

As a method of stripping resists when bumps are formed or circuit substrates are fabricated, it is common to employ wet stripping, which is a method of stripping resists using a stripping solution. Stripping solutions used in such a wet stripping are required to fulfill as chief conditions the following two points.

1) They can completely strip photoresists having been cured and changed in quality as a result of high-temperature post-baking carried out in order to strengthen the adhesion between substrates and photoresists or as a result of oxygen plasma etching carried out in order to improve the wettability of plating solutions, and have a high stripping performance.

2) They can be handled with ease, have less toxicity, and be safe.

Acidic stripping solutions or alkaline stripping solutions are conventionally used as stripping solutions for photoresists. As representative acidic stripping solutions, stripping solutions prepared by mixing phenol compounds, chlorine type solvents or aromatic hydrocarbons in alkylbenzene-sulfonic acids are commercially available. These conventional products, however, not only have not sufficient ability to strip alkali-developable negative photoresists but also contain phenol compounds with a strong toxicity or contain chlorine type solvents causing of environmental pollution. On the other hand, as alkaline stripping solutions, stripping solutions comprised of water-soluble organic amines and organic solvents such as dimethyl sulfoxide are commercially available. They, however, have problems that, like the acidic stripping solutions that they do not have no sufficient ability to strip alkali-developable negative photoresists, and also that stripping solutions containing a large quantity a high-melting point polar solvent such as dimethyl sulfoxide may freeze when stored outdoors in the winter, to becoming difficult to handle.

SUMMARY OF THE INVENTION

An object of the present invention is to provide a negative photoresist stripping liquid composition that has a superior stripping performance against thick films formed of a negative photoresist useful for bump formation and for fabricating circuit substrates, in particular, a negative photoresist that is alkali-developable and can form films of at least 20 μm in thickness; and has lesson toxicity and may less the problem of environmental pollution as compared to conventional stripping solutions.

To achieve the above object, the present invention provides a negative photoresist stripping liquid composition comprising from 30 to 75% by weight of dimethyl sulfoxide, from 20 to 65% by weight of 1, 3-dimethyl-2-imidazolidinone, from 0.1 to 5% by weight of a tetraalkylammonium hydroxide and from 0.5 to 15% by weight of water.

The present invention also provides a negative photoresist stripping process making use of the above stripping liquid composition, and a bump and a circuit substrate which are formed and fabricated by the stripping process.

The negative photoresist stripping liquid composition is superior to conventional stripping solutions with regard to toxicity and environmental pollution and moreover has a superior stripping performance. It also has an advantageous feature that it may hardly freeze even during low-temperature storage which is a problem when it is stored in the winter. In particular, the stripping liquid composition exhibits a superior stripping performance even against thick-film resists formed using the negative photoresist that is alkali-developable and can form films of at least 20 μm in thickness, and is effective in the formation and fabrication of bumps and circuit substrates in narrow pitches and in a high density, without resulting in any unstrapped resist on the substrate.

DETAILED DESCRIPTION OF THE PREFERRED EMBODIMENTS

The present invention will be described below in detail.

Stripping Liquid Composition:

The negative photoresist stripping liquid composition of the present invention contains dimethyl sulfoxide, 1,3-dimethyl-2-imidazolidinone, a tetraalkylammonium hydroxide and water each in the stated quantity.

The tetraalkylammonium hydroxide used in the stripping liquid composition refers to a compound wherein the four hydrogen atoms bonded to the nitrogen atom of ammonium hydroxide have been all substituted with alkyl groups. The substituents four alkyl groups may be the same or different and are unsubstituted or substituted alkyl groups. The unsubstituted alkyl groups may be alkyl groups having 1 to 4 carbon atoms and, in particular, exemplified by a methyl group, an ethyl group and a n-butyl group. The substituted alkyl groups may preferably be alkyl groups having 1 to 4 carbon atoms wherein hydrogen atoms thereof have been substituted with a hydroxyl group, an alkoxyl group (e.g., those having 1 to 4 carbon atoms) or a hydroxyalkoxyl group (e.g., those having 2 to 4 carbon atoms), as exemplified by a 2-hydroxyethyl group, a 3-hydroxypropyl group, a 4-hydroxybutyl group, a 2-methoxyethyl group and a 2-(2-hydroxyethoxy)ethyl group. As examples of such a tetraalkylammonium hydroxide, it may include tetramethylammonium hydroxide, tetraethylammonium hydroxide, tetra(n-butyl)ammonium hydroxide, tetra(2-hydroxyethyl)ammonium hydroxide, trimethyl(2-hydroxyethyl)ammonium hydroxide, trimethyl{2-(2-hydroxyethoxy (ethyl)}ammonium hydroxide and dimethyldiethylammonium hydroxide. In particular, tetramethylammonium hydroxide and trimethyl(2-hydroxyethyl)ammonium hydroxide may preferably be used. Any of these may be used singly or in combination of two or more.

With regard to the amounts of the respective components, the dimethyl sulfoxide is present in an amount of from 30 to 75% by weight, preferably from 40 to 70% by weight, and more preferably from 50 to 70% by weight. If the amount of dimethyl sulfoxide is less than 30t by weight, any resist pieces stripped from the substrate can not sufficiently dissolve so that there is a possibility that the resist pieces again adhere to the substrate. If on the other hand it is present in an amount of more than *75% by weight, the problem of freezing may be present when the composition is stored at low temperature, as in storage outdoors in the winter.

The 1,3-dimethyl-2-imidazolidinone is present in an amount of from 20 to 65% by weight, preferably from 25 to 60% by weight, and more preferably from 25 to 40% by weight. If the amount of 1,3-dimethyl-2-imidazolidinone is less than 20% by weight, the problem of freezing may be present when the composition is stored as low-temperature. If on the other hand it is present in amount of more than 65t by weight, it may take a long time to strip the resist.

The tetraalkylammonium hydroxide is present in an amount of from 0.1 to 5% by weight, preferably from 0.3 to 3% by weight, and more preferably from 0.5 to 25% by weight. If the amount of tetraalkylammonium hydroxide is less than 0.1% by weight, the resist stripping performance may be poor. If on the other hand it is present in an amount of more than 5% by weight, there is a possibility of it attacking the substrate or the plated metal.

The water is present in an amount of from 0.5 to 15% by weight, preferably from 1 to 10% by weight, and more preferably from 5 to 10% by weight. If the amount of water is in a less than 1% by weight, there is a possibility that the tetraalkylammonium hydroxide does not dissolve well in the stripping solution to cause difficulty in that the stripping solution is non-uniform. If on the other hand it is present in an amount of more than 15% by weight, low stripping performance may result.

Additional Components:

In the stripping liquid composition of the present invention, additional components known in the art may be mixed so long as the object and effect of the present invention are not impaired. As an example of the additional components, a surface-active agent may be used for the purpose of decreasing surface tension to improve affinity for the photoresist. The surface-active agent may include, e.g., fluorine-containing surface-active agents commercially available under the trade names of BM-1000 and BM-1000 (available from MB Chemie Co.); MEGAFAC F142D, ditto F172, ditto F173 and ditto F183 (available from Dainippon Ink & Chemicals, Incorporated); FLUORAD FC-135, ditto FC-170C, ditto FC-430 and ditto FC-431 (available from Sumitomo 3M Limited); SURFRON S-112, ditto S-113, ditto S-131, ditto S-141 and ditto S-145 (available from Asahi Glass Co., Ltd.); SH-28PA, SH-190, SH-193, SZ-6032 and SF-8428 (available from Toray Silicone Co., Ltd.); etc.

Use and Usefulness of the Stripping Liquid Composition:

A process for forming a conductive metal element such as bumps and wiring on a substrate, and a process for fabricating a circuit substrate, by the use of the above negative photoresist stripping liquid composition of the present invention will be described below.

That is, the present invention provides a process for forming a conductive metal element on a substrate, the process comprising the steps of:

coating an alkali-developable negative photoresist composition on a substrate covered with a barrier metal layer, to form a photoresist film;

selectively exposing the photoresist film;

developing the photoresist film having been exposed, to form a patterned photoresist film;

plating the substrate at its areas from which the photoresist film has been removed by development; and bringing the substrate thus plated, into contact with the above-described stripping liquid composition according to the present invention to remove the photoresist film remaining on the substrate.

Stated more specifically, an alkali-developable negative photoresist is coated on a substrate covered with a barrier metal layer formed of copper, gold, palladium, titanium, chromium or the like, to form a photoresist film, and the photoresist film is exposed to light through a given mask, followed by development to form a given resist pattern. The photoresist used here may preferably be not a cyclized rubber type negative photoresist conventionally used, but an alkali-developable negative photoresist, which may swell less at the time of development than the former photoresist and has a superior resolution. When used to form bumps or make wiring, the photoresist must be made into a film of at least 10 $\mu$m, preferably at least 20 $\mu$m in thickness. After the resist pattern has been formed, the areas from which the photoresist film has been removed by development (i.e., unexposed areas) are plated. In this instance, as the manner of plating, any of electrolytic plating and electroless plating may be selected as desined. As metal species for the plating, any of gold, copper, solder, nickel and so forth may be selected as desined.

After the plating has been completed, the substrate thus plated is brought into contact with the stripping liquid composition of the present invention to remove the photoresist film remaining on the substrate.

The stripping solution brought into contact with the substrate may preferably have a temperature of from 40 to 95° C., and more preferably from 50 to 85° C. If the stripping solution has a temperature lower than 40° C., the rate of stripping may be too low to be practical. If the stripping solution has a temperature higher than 95° C., the water present in the stripping solution may so vigorously evaporate so as to make the stripping solution unusable.

There are no particular limitations on the manner of bringing the substrate into contact with the stripping solution. For example, the substrate may be immersed in the stripping solution. Stated specifically, the substrate from which the photoresist is to be removed is immersed in a stripping bath constituting the stripping solution. At this stage, the stripping solution may preferably be agitated or be subjected to ultrasonic waves so that the stripping can be accelerated. As another method, the substrate may be brought into contact with the stripping solution by feeding the stripping solution to the substrate in the form of a shower.

The time during which the substrate is brought into contact with the stripping solution may be appropriately selected according to mask pattern shape, resist layer thickness, stripping solution temperature, how to strip and so forth. In the case when stripped by immersion, the substrate may be brought into contact with the stripping solution for about 2 to 20 minutes. After the resist has been stripped, the substrate is washed with water, followed by blowing of dry air or baking to dry the substrate.

As a result of the foregoing process, the metal formed by plating in a height of at least 10 $\mu$m remains on the substrate in a patterned state. When the plating is in the form of dots, the metal dots (columnar protuberances) are used as bumps. When the plating is in the form of lines, the metal lines are used as circuit wiring. The bumps or wiring thus formed by the above process can have narrower pitches and a higher aspect ratio than ever, and hence are useful for packaging semiconductor devices in a high density and for fabricating high-density wiring substrates.

EXAMPLES

The present invention will be described below in greater detail by giving Examples. The present invention is by no means limited to these.

Example 1

Dimethyl sulfoxide (hereinafter "DMSO"), 1,3-dimethyl-2-imidazolidinone (hereinafter "DMI"), tetramethylammonium hydroxide (hereinafter "TMAH") and water were mixed and stirred at room temperature for 10 minutes. These components are present in an amount 50% by weight, 40% by weight, 2% by weight and 8% by weight, respectively. Thus, a stripping liquid composition was prepared.

Examples 2 to 9. Comparative Examples 1 to 7

Stripping liquid compositions were prepared in the same manner as in Example 1 except that in each example the composition was formulated as shown in Table 1.
Evaluation Tests The compositions of Examples 1 to 9 and Comparative Examples 1 to 7 were tested to evaluate their uniformity before stripping, stripping performance and low-temperature storage stability in the following way. Results obtained are shown in Table 1.

1. Evaluation of Uniformity:

A stripping liquid composition is placed into a 2 liter beaker in an amount of 1 liter. The stripping solution is heated to a stated temperature while agitating it by means of a magnetic stirrer, and this state is kept for 20 minutes. How the stripping liquid composition having been kept at a stated temperature for 20 minutes appeared before stripping is observed to evaluate the uniformity of the stripping liquid composition. According to the results obtained, where the composition is a uniform transparent solution and is in a good state it is evaluated as "◯"; and where it is non-uniform and turbid and is in a poor state, as "X".

With regard to the compositions evaluated to have a good uniformity, their stripping performance was further evaluated in the following way.

2. Evaluation of Stripping Performance:

As an alkali-developable, thick-film forming negative photoresist, the following photoresist was prepared.

|  | (by weight) |
|---|---|
| Methacrylic acid/dicyclopentanyl methacrylate/1,3-butadiene (25/45/15/15 parts) copolymer | 100 parts |
| Glycerol triacrylate | 50 parts |
| 2,2-Dimethoxy-2-phenylacetophenone | 25 parts |
| FLUORAD FC-430 (available from Sumitomo 3M Limited) | 0.5 parts |
| Methyl 3-methoxypropionate | 120 parts |

A photoresist formulated as described above was coated on a 4-inch wafer by spin coating, and the coating formed was prebaked at 90° C. for 10 minutes using a hot plate to form a resist film of 50 $\mu$m in thickness, followed by exposure at 500 mJ through a mask by means of an exposure machine (Contact Aligner MA100, manufactured by Karl Zoos Japan Co.). Next, the resist film having been exposed was developed with an aqueous tetramethylammonium hydroxide solution to obtain a substrate on which the negative photoresist was patterned as desired (hereinafter "resist-patterned substrate"). This resist-patterned substrate was post-baked at 100° C. for 10 minutes. A plurality of resist-patterned substrates were produced in the same manner, and were put to the following stripping test.

One substrate of the resist-patterned substrates thus produced was immersed in each of the above stripping liquid compositions for 10 minutes, and thereafter taken out to visually observe how the photoresist was stripped. Next, another resist-patterned substrate was immersed for 10 minutes in the same manner as the first substrate, and thereafter taken out to similarly observe how the photoresist was stripped. Subsequently, the remaining resist-patterned substrates were immersed in the same manner one after another. As the result, where the photoresist was completely strippable from at least 10 substrates it was evaluated as "◯"; where the photoresist was completely strippable from 5 to 9 substrates, as "Δ"; and an instance where the photoresist was completely strippable from only 0 to 4 substrates, as "X".

With regard to the compositions evaluated to have a good stripping performance, the following storage stability was further evaluated in the following way.

3. Evaluation of Storage Stability:

To examine the low-temperature storage stability of the stripping liquid compositions, how the stripping liquid compositions appearance after their storage at 5° C. for 72 hours was observed to make evaluation. As the result, where the composition did not freeze also after storage and was kept in uniform liquid it was evaluated as "○"; and where the composition froze, as "X".

TABLE 1

| | Formulation of stripping solution (wt. %) | State of stripping solution before stripping | Stripping solution temperature (° C.) | Stripping test results | Low-temperature storage stability |
|---|---|---|---|---|---|
| Example 1 | DMSO/DMI/TMAH/WATER = 50/40/2/8 | ○ | 50 | ○ | ○ |
| Example 2 | DMSO/DMI/TMAH/WATER = 65/25/2/8 | ○ | 50 | ○ | ○ |
| Example 3 | DMSO/DMI/TMAH/WATER = 35/55/2/8 | ○ | 50 | ○ | ○ |
| Example 4 | DMSO/DMI/TMAH/WATER = 70/25/1/4 | ○ | 60 | ○ | ○ |
| Example 5 | DMSO/DMI/TMAH/WATER = 35/60/1/4 | ○ | 60 | ○ | ○ |
| Example 6 | DMSO/DMI/TMAH/WATER = 70/28/0.5/1.5 | ○ | 80 | ○ | ○ |
| Example 7 | DMSO/DMI/TMAH/WATER = 38/60/0.5/1.5 | ○ | 80 | ○ | ○ |
| Example 8 | DMSO/DMI/trimethyl (2-hydroxyethyl) ammonium hydroxide/ WATER = 50/40/2/8 | ○ | 60 | ○ | ○ |
| Example 9 | DMSO/DMI/trimethyl (2-hydroxyethyl) ammonium hydroxide/ WATER = 35/60/1/4 | ○ | 60 | ○ | ○ |
| Comp. Example 1 | DMSO/DMI/TMAH/WATER = 80/15/1/4 | ○ | 60 | ○ | x |
| Comp. Example 2 | DMSO/DMI/TMAH/WATER = 10/85/1/4 | x | 60 | (—) | (—) |
| Compa. Example 3 | DMSO/DMI/TMAH/WATER = 65/30/0.05/4.95 | ○ | 60 | x | ○ |
| Compa. Example 4 | DMSO/DMI/TMAH/WATER = 55/24/1/20 | ○ | 60 | x | ○ |
| Comp. Example 5 | DMSO/DMI/TMAH/WATER = 55/43.9/1/0.1 | x | 60 | (—) | (—) |
| Comp. Example 6 | DMSO/DMI/TMAH/WATER = 70/25/1/4 | ○ | 30 | x | (—) |
| Comp. Example 7 | DMSO/DMI/TMAH/WATER = 70/25/1/4 | x | 100 | (—) | (—) |

Remarks
(—): Not evaluated.

What is claimed is:

1. A negative photoresist stripping liquid composition consisting essentially of from 30% by weight to 75% by weight of dimethyl sulfoxide, from 20% by weight to 65% by weight of 1,3-dimethyl-2-imidazolidinone, from 0.1% by weight to 5% by weight of a tetraalkylammonium hydroxide and from 0.5% by weight to 15% by weight of water.

2. The composition of claim 1, wherein said dimethyl sulfoxide is in a content of from 40% by weight to 70% by weight, said 1,3-dimethyl-2-imidazolidinone from 25% by weight to 60% by weight, said tetraalkylammonium hydroxide from 0.3% by weight to 3% by weight, and said water from 1% by weight to 10% by weight.

3. The composition of claim 1, wherein said dimethyl sulfoxide is in a content of from 50% by weight to 70% by weight, said 1,3-dimethyl-2-imidazolidinone from 20% by weight to 40% by weight, said tetraalkylammonium hydroxide from 0.5% by weight to 2.5% by weight, and said water from 1.5% by weight to 10% by weight.

4. The composition of claim 1, wherein said tetraalkylammonium hydroxide is a compound selected from the group consisting of tetramethylammonium hydroxide, tetraethylammonium hydroxide, tetra(n-butyl)ammonium hydroxide, tetra(2-hydroxyethyl)ammonium hydroxide, trimethyl(2-hydroxyethyl)amonium hydroxide, trimethyl{2-(2-hydroxyethoxy(ethyl)}ammonium hydroxide and dimethyldiethylammonium hydroxide.

5. The composition of claim 1, wherein said tetraalkylammonium hydroxide is a compound selected from the group consisting of tetramethylammonium hydroxide and tetra(2-hydroxyethyl)ammonium hydroxide.

6. The composition of claim 1, which is used for stripping an alkali-developable negative photoresist.

7. A process for forming a conductive metal element on a substrate, the process comprising the steps of:

coating an alkali-developable negative photoresist composition on a substrate covered with a barrier metal layer, to form a photoresist film;

selectively exposing the photoresist film;

developing the photoresist film having been exposed, to form a patterned photoresist film;

plating the substrate at its areas from which the photoresist film has been removed by development; and bringing the substrate thus plated, into contact with the stripping liquid composition according to claim 1 to remove the photoresist film remaining on the substrate.

8. The process of claim 7, wherein said conductive metal element is a columnar bump.

9. The process of claim 7, wherein said conductive metal element is line-pattern wiring.

10. The process of claim 7, wherein said substrate is brought into contact with said stripping liquid composition by immersing said substrate in said composition.

11. The process of claim 7, wherein said substrate is brought into contact with said stripping liquid composition by feeding said composition to said substrate in a shower.

12. The process of claim 7, wherein said stripping liquid composition with which said substrate is brought into contact has a temperature of from 40° C. to 95° C.

13. The process of claim 7, wherein said substrate is plated by electrolytic plating or electroless plating.

14. The process of claim 7, wherein said substrate is plated with gold, copper, solder or nickel.

15. The process of claim 7, wherein said photoresist film formed on the substrate has a thickness of at least 10 μm.

16. A negative photoresist stripping liquid composition consisting of from 30% by weight to 75% by weight of dimethyl sulfoxide, from 20% by weight to 65% by weight of 1,3-dimethyl-2-imidazolidinone, from 0.1% by weight to 5% by weight of a tetraalkylammonium hydroxide and from 0.5% by weight to 15% by weight of water.

* * * * *